(12) United States Patent
Liu et al.

(10) Patent No.: US 11,222,590 B2
(45) Date of Patent: Jan. 11, 2022

(54) ELECTRICAL SIGNAL DETECTION MODULE, DRIVING METHOD, PIXEL CIRCUIT AND DISPLAY DEVICE

(71) Applicant: BOE TECHNOLOGY GROUP CO., LTD., Beijing (CN)

(72) Inventors: Wei Liu, Beijing (CN); Xue Dong, Beijing (CN); Haisheng Wang, Beijing (CN); Xiaoliang Ding, Beijing (CN); Yingming Liu, Beijing (CN); ChihJen Cheng, Beijing (CN); Xueyou Cao, Beijing (CN); Yanling Han, Beijing (CN); Changfeng Li, Beijing (CN); Pengpeng Wang, Beijing (CN); Ping Zhang, Beijing (CN); Rui Xu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 434 days.

(21) Appl. No.: 16/346,358

(22) PCT Filed: Oct. 17, 2018

(86) PCT No.: PCT/CN2018/110640
§ 371 (c)(1),
(2) Date: Apr. 30, 2019

(87) PCT Pub. No.: WO2019/091268
PCT Pub. Date: May 16, 2019

(65) Prior Publication Data
US 2021/0327353 A1    Oct. 21, 2021

(30) Foreign Application Priority Data
Nov. 7, 2017  (CN) .......................... 201711084413.2

(51) Int. Cl.
*G09G 3/3258* (2016.01)
*H01L 27/32* (2006.01)
*G09G 3/3233* (2016.01)

(52) U.S. Cl.
CPC ......... *G09G 3/3258* (2013.01); *G09G 3/3233* (2013.01); *G09G 2300/0819* (2013.01);
(Continued)

(58) Field of Classification Search
CPC .............. G09G 3/3258; G09G 3/3233; G09G 2300/0819; G09G 2300/0842;
(Continued)

(56) References Cited

U.S. PATENT DOCUMENTS 7,876,292 B2 * 1/2011 Cho ........................ H01L 27/32
345/76
2002/0180685 A1   12/2002 Itakura et al.
(Continued)

FOREIGN PATENT DOCUMENTS

CN    101228450 A    7/2008
CN    101282109 A    10/2008
(Continued)

OTHER PUBLICATIONS

First Chinese Office Action dated Mar. 27, 2019, received for corresponding Chinese Application No. 201711084413.2.
(Continued)

*Primary Examiner* — Tom V Sheng
(74) *Attorney, Agent, or Firm* — Kinney & Lange, P.A.

(57) ABSTRACT

An electrical signal detection module includes a photoelectrical signal application circuitry, an operational amplifier, a gain control circuitry and a master control circuitry. The gain control circuitry includes at least two gain control sub-circuitries connected in parallel to each other, and a discharge switching sub-circuitry connected in parallel to the
(Continued)

gain control sub-circuitries. Each gain control sub-circuitry includes a gain switching sub-circuitry and a gain capacitive sub-circuitry connected in series to each other. The master control circuitry is configured to apply a discharge switching signal to the discharge switching sub-circuitry, and apply a gain switching control signal to the corresponding gain switching sub-circuitry. The gain switching sub-circuitry is configured to control a first end and a second end of the gain switching sub-circuitry to be electrically connected to each other in accordance with the gain switching control signal. The discharge switching sub-circuitry is configured to enable a first end of the gain capacitive sub-circuitry connected to the gain switching sub-circuitry to be electrically connected to, or electrically disconnected from, a second end of the gain capacitive sub-circuitry in accordance with the discharge switching signal.

20 Claims, 7 Drawing Sheets

(52) U.S. Cl.
CPC ........... *G09G 2300/0842* (2013.01); *G09G 2310/0291* (2013.01); *G09G 2310/06* (2013.01); *G09G 2360/145* (2013.01); *H01L 27/3269* (2013.01)

(58) Field of Classification Search
CPC ....... G09G 2310/0291; G09G 2310/06; G09G 2320/0295; G09G 2360/145; G09G 2360/148; H01L 27/3269
USPC .......................................... 345/207
See application file for complete search history.

(56) References Cited

U.S. PATENT DOCUMENTS

| | | | | |
|---|---|---|---|---|
| 2006/0007205 | A1* | 1/2006 | Reddy | H01L 27/288 345/204 |
| 2006/0237627 | A1 | 10/2006 | Gardner et al. | |
| 2006/0238477 | A1 | 10/2006 | Lew et al. | |
| 2007/0235741 | A1* | 10/2007 | Nakamura | B41J 2/45 257/79 |
| 2008/0238539 | A1 | 10/2008 | Higuchi | |
| 2009/0303172 | A1 | 12/2009 | Park et al. | |
| 2010/0060562 | A1 | 3/2010 | Hadwen et al. | |
| 2011/0007102 | A1 | 1/2011 | Ogura et al. | |
| 2011/0109605 | A1* | 5/2011 | Omori | G09G 3/3648 345/207 |
| 2011/0157077 | A1* | 6/2011 | Martin | G06F 3/0446 345/174 |
| 2012/0086694 | A1 | 4/2012 | Tseng et al. | |
| 2015/0008841 | A1 | 1/2015 | Wu et al. | |
| 2015/0048881 | A1 | 2/2015 | Kwon et al. | |
| 2016/0117980 | A1 | 4/2016 | Wu et al. | |
| 2017/0053590 | A1* | 2/2017 | Song | G09G 3/3225 |
| 2019/0156747 | A1 | 5/2019 | Nie et al. | |

FOREIGN PATENT DOCUMENTS

| | | |
|---|---|---|
| CN | 101546539 A | 9/2009 |
| CN | 101546986 A | 9/2009 |
| CN | 101589477 A | 11/2009 |
| CN | 101604972 A | 12/2009 |
| CN | 101950533 A | 1/2011 |
| CN | 102333195 A | 1/2012 |
| CN | 102523394 A | 6/2012 |
| CN | 103033262 A | 4/2013 |
| CN | 103137072 A | 6/2013 |
| CN | 103247261 A | 8/2013 |
| CN | 103384313 A | 11/2013 |
| CN | 104700761 A | 6/2015 |
| CN | 106328061 A | 1/2017 |
| CN | 107086023 A | 8/2017 |
| CN | 107749273 A | 3/2018 |
| KR | 20030083088 A | 10/2003 |

OTHER PUBLICATIONS

International Search Report and English Translation of Box V of the Written Opinion dated Jun. 21, 2018, received cor corresponding PCT Application No. PCT/CN2018/110640.

* cited by examiner

ELECTRICAL SIGNAL DETECTION MODULE, DRIVING METHOD, PIXEL CIRCUIT AND DISPLAY DEVICE

CROSS-REFERENCE TO RELATED APPLICATION

The present application is the U.S. national phase of PCT Application No. PCT/CN2018/110640 filed on Oct. 17, 2018, which claims a priority of the Chinese patent application 201711084413.2 filed on Nov. 7, 2017, which are incorporated herein by reference in their entirety.

TECHNICAL FIELD

The present disclosure relates to the field of display driving technology, in particular to an electrical signal detection module, a driving method, a pixel circuit and a display device.

BACKGROUND

In the related art, a real-time detection and compensation method through a subpixel-level optical sensor has been proposed for an organic light-emitting diode (OLED) compensation circuit. The optical sensor is sensitive to spectra at different wavelengths differently, and a contrast of an OLED panel is increasingly demanded, so an optical sensing capability of the optical sensor is increasingly demanded too. However, for a conventional optical-detection-based pixel compensation circuit, it is impossible to dynamically adjust an electrical signal detection module in accordance with a range of a grayscale voltage, so it is impossible to accurately perform the compensation with respect to the spectra at different wavelengths and images having different brightness values.

SUMMARY

In one aspect, the present disclosure provides in some embodiments an electrical signal detection module for a pixel compensation circuitry. Each pixel sub-circuitry is configured to drive a light-emitting element, and the pixel compensation circuitry includes a read line. The electrical signal detection module includes a photoelectrical signal application circuitry, an operational amplifier, a gain control circuitry and a master control circuitry. The photoelectrical signal application circuitry includes a photoelectrical signal output end. The photoelectrical signal application circuitry is configured to apply an electrical signal corresponding to an optical signal from the light-emitting element via the photoelectrical signal output end. The operational amplifier includes a positive phase input end configured to receive a reference voltage, a negative phase input end connected to the photoelectrical signal output end and an output end connected to the read line. The gain control circuitry includes at least two levels of gain control sub-circuitries connected in parallel to each other and a discharge switching sub-circuitry connected in parallel to each gain control sub-circuitry, and each gain control sub-circuitry includes a gain switching sub-circuitry and a gain capacitive sub-circuitry connected in series to each other. A first end of the gain switching sub-circuitry is connected to the negative phase input end, a second end of the gain switching sub-circuitry is connected to a first end of the gain capacitive sub-circuitry, a second end of the gain capacitive sub-circuitry is connected to the output end, and the gain capacitive sub-circuitries of different gain control sub-circuitries have different capacitances. The master control circuitry is configured to apply a discharge switching signal to the discharge switching sub-circuitry, and apply a gain switching control signal to the corresponding gain switching sub-circuitry in accordance with a grayscale voltage applied to the pixel sub-circuitry. Each gain switching sub-circuitry is configured to control the first end of the gain switching sub-circuitry to be electrically connected to the second end of the gain switching sub-circuitry in accordance with the gain switching control signal. The discharge switching sub-circuitry is configured to control the first end of each gain capacitive sub-circuitry connected to the gain switching sub-circuitry to be electrically connected to, or electrically disconnected from, the second end of the gain capacitive sub-circuitry in accordance with the discharge switching signal.

In some possible embodiments of the present disclosure, the master control circuitry includes a master control sub-circuitry and a gain switching control sub-circuitry. The master control sub-circuitry is configured to acquire grayscale voltage information so as to generate the discharge switching signal, and transmit the discharge switching signal to the discharge switching circuitry. The grayscale voltage information is information indicating a voltage range within which the grayscale voltage applied to the pixel sub-circuitry is located. The gain switching control sub-circuitry is configured to apply the gain switching control signal to the corresponding gain switching sub-circuitry in accordance with the grayscale voltage information, so as to enable the first end and the second end of the gain switching sub-circuitry to be electrically connected to each other.

In some possible embodiments of the present disclosure, the photoelectrical signal application circuitry includes a photosensing sub-circuitry, a read control sub-circuitry and a storage capacitor. The photosensing sub-circuitry includes a photosensing output end. The photosensing sub-circuitry is configured to convert the optical signal from the corresponding pixel sub-circuitry into an electrical signal, and output the electrical signal via the photosensing output end. A first end of the storage capacitor is connected to the photosensing output end, and a second end of the storage capacitor is connected to a first voltage input end. A first end of the read control sub-circuitry is connected to the photosensing output end, and a second end of the read control sub-circuitry is connected to the negative phase input end of the operational amplifier. The read control sub-circuitry is configured to, under the control of a read control signal, control the photosensing output end to be electrically connected to, or electrically disconnected from, the negative phase input end of the operational amplifier.

In some possible embodiments of the present disclosure, a control end of the read control sub-circuitry is connected to the read control line. The master control circuitry further includes a read control signal control sub-circuitry configured to generate the read control signal in accordance with the grayscale voltage information and transmit the read control signal to the read control line.

In some possible embodiments of the present disclosure, the electrical signal detection module further includes at least two voltage-adjustable input ends. The photosensing sub-circuitry includes a photosensitive diode, a cathode of which is connected to the first end of the storage capacitor. The electrical signal detection module further includes a bias voltage switching circuitry, and the master control circuitry further includes a bias voltage control sub-circuitry. An anode of the photosensitive diode is connected to the at least two voltage-adjustable input ends via the bias voltage switching circuitry. A control end of the bias voltage switching circuitry is connected to the bias voltage control sub-circuitry. The bias voltage control sub-circuitry is configured to apply a bias voltage control signal to the bias voltage switching circuitry in accordance with the grayscale voltage information, so as to enable the corresponding voltage-adjustable input end to be electrically connected to the anode of the photosensitive diode.

In another aspect, the present disclosure provides in some embodiments a method for driving the above-mentioned electrical signal detection module, including: setting a reading time period and a discharging time period prior to the reading time period; applying, by a master control circuitry within the discharging time period and the reading time period, a gain switching control signal to a corresponding gain switching sub-circuitry in accordance with a grayscale voltage applied to a pixel sub-circuitry, so as to enable a first end of the gain switching sub-circuitry to be electrically connected to a second end of the gain switching sub-circuitry; applying, by the master control circuitry within the discharging time period, a discharge switching signal to a discharge switching sub-circuitry, so as to control the discharge switching sub-circuitry to enable a first end of a gain capacitive sub-circuitry connected to the gain switching sub-circuitry to be electrically connected to a second end of the gain capacitive sub-circuitry, thereby to release charges stored in the gain capacitive sub-circuitry; and controlling, by the master control circuitry within the reading time period, the discharge switching sub-circuitry to enable the first end of the gain capacitive sub-circuitry to be electrically disconnected from the second end of the gain capacitive sub-circuitry.

In some possible embodiments of the present disclosure, the master control circuitry includes a master control sub-circuitry and a gain switching control sub-circuitry. The applying, by the master control circuitry within the discharging time period and the reading time period, the gain switching control signal to the corresponding gain switching sub-circuitry in accordance with the grayscale voltage applied to the pixel sub-circuitry so as to enable the first end of the gain switching sub-circuitry to be electrically connected to the second end of the gain switching sub-circuitry includes: acquiring, by the master control sub-circuitry within the discharging time period and the reading time period, grayscale voltage information so as to generate the discharge switching signal, and applying the discharge switching signal to the discharge switching sub-circuitry, the grayscale voltage information being information indicating a voltage range within which the grayscale voltage applied to the pixel sub-circuitry is located; and applying, by the gain switching control sub-circuitry within the discharging time period and the reading time period, a gain switching control signal to the corresponding gain switching sub-circuitry in accordance with the grayscale voltage information, so as to enable the first end of the gain switching sub-circuitry to be electrically connected to the second end of the gain switching sub-circuitry.

In some possible embodiments of the present disclosure, the grayscale voltage information includes first grayscale voltage information and second grayscale voltage information. The first grayscale voltage information is information indicating that the grayscale voltage is located within a first voltage range, and the second grayscale voltage information is information indicating that the grayscale voltage is located within a second voltage range. The first voltage range is greater than a first predetermined voltage and smaller than a second predetermined voltage, and the second voltage range is greater than a third predetermined voltage and smaller than a fourth predetermined voltage. The first predetermined voltage is smaller than the second predetermined voltage, and the third predetermined voltage is smaller than the fourth predetermined voltage and greater than the second predetermined voltage. The applying, by the gain switching control sub-circuitry within the discharging time period and the reading time period, the gain switching control signal to the corresponding gain switching sub-circuitry in accordance with the grayscale voltage information so as to enable the first end of the gain switching sub-circuitry to be electrically connected to the second end of the gain switching sub-circuitry includes: applying, by the gain switching control sub-circuitry, a first gain switching control signal to a first gain switching sub-circuitry in accordance with the first grayscale voltage information, so as to enable a first end of the first gain switching sub-circuitry to be electrically connected to a second end of the first gain switching sub-circuitry; and applying, by the gain switching control sub-circuitry, a second gain switching control signal to a second gain switching sub-circuitry in accordance with the second grayscale voltage information, so as to enable a first end of the second gain switching sub-circuitry to be electrically connected to a second end of the second gain switching sub-circuitry. The gain capacitive sub-circuitries include a first gain capacitive sub-circuitry and a second gain capacitive sub-circuitry having a capacitance greater than the first gain capacitive sub-circuitry. The first gain capacitive sub-circuitry is connected in series to the first gain switching sub-circuitry, and the second gain capacitive sub-circuitry is connected in series to the second gain switching sub-circuitry.

In some possible embodiments of the present disclosure, the photoelectrical signal application circuitry includes a photosensing sub-circuitry, a read control sub-circuitry and a storage capacitor. A control end of the read control sub-circuitry is connected to a read control line, and the master control circuitry further includes a read control signal control sub-circuitry. The method further includes generating, by the read control signal control sub-circuitry, a corresponding read control signal in accordance with the grayscale voltage information, and transmitting the read control signal to the read control line.

In some possible embodiments of the present disclosure, a resetting time period is set prior to the reading time period, and an integration time period is set between the resetting time period and the reading time period. The method further includes: within the resetting time period, resetting a voltage applied to a first end of the storage capacitor, so as to empty charge signals stored in the storage capacitor; within the integration time period, converting, by the photosensing sub-circuitry, an optical signal from the pixel sub-circuitry into an electrical signal, and storing the electrical signal in the storage capacitor; and within the reading time period, controlling, by the read control sub-circuitry under the control of the read control signal, the first end of the storage capacitor to be electrically connected to a negative phase input end of an operational amplifier, so that the operational amplifier outputs a voltage signal corresponding to the electrical signal acquired by the photosensing sub-circuitry to the read line. An integration time corresponding to the read control signal is a duration of the integration time period.

In some possible embodiments of the present disclosure, a first integration time corresponding to a first read control signal is greater than a second integration time corresponding to a second read control signal. The first read control signal is a read control signal corresponding to the first grayscale voltage information, and the second read control signal is a read control signal corresponding to the second grayscale voltage information.

In some possible embodiments of the present disclosure, the photosensing sub-circuitry includes a photosensitive diode, an anode of which is connected to a voltage-adjustable input end and a cathode of which is connected to the first end of the storage capacitor. The number of the voltage-adjustable input ends is at least two. The electrical signal detection module further includes a bias voltage switching circuitry, and the master control circuitry further includes a bias voltage control sub-circuitry. The anode of the photosensitive diode is connected to the at least two voltage-adjustable input ends via the bias voltage switching circuitry, and a control end of the bias voltage switching circuitry is connected to the bias voltage control sub-circuitry. The method further includes applying, by the bias voltage control sub-circuitry, a bias voltage control signal to the bias voltage switching circuitry in accordance with the grayscale voltage information, so as to enable the corresponding voltage-adjustable input end to be electrically connected to the anode of the photosensitive diode.

In some possible embodiments of the present disclosure, an absolute value of a first adjustable voltage applied to the first voltage-adjustable input end is greater than an absolute value of a second adjustable voltage applied to a second voltage-adjustable input end. The first adjustable voltage is an adjustable voltage applied to the first voltage-adjustable input end corresponding to the first grayscale voltage information, and the second adjustable voltage is an adjustable voltage applied to the second voltage-adjustable input end corresponding to the second grayscale voltage information.

In yet another aspect, the present disclosure provides in some embodiments a pixel circuit including a plurality of pixel unit circuitries arranged in rows and columns. Each pixel unit circuitry includes a pixel sub-circuitry and a pixel compensation circuitry, the pixel compensation circuitry includes the above-mentioned electrical signal detection module, and the pixel unit circuitries in a same column are connected to a same read line.

In still yet another aspect, the present disclosure provides in some embodiments a display device including the above-mentioned pixel circuit and a grayscale voltage determination circuit. The grayscale voltage determination circuit is configured to acquire a grayscale voltage applied to each pixel sub-circuitry, determine a voltage range within which the grayscale voltage is located, and generate grayscale voltage information indicating the voltage range within which the grayscale voltage applied to the pixel sub-circuitry is located.

BRIEF DESCRIPTION OF THE DRAWINGS

In order to better clarify technical solutions in embodiments of the present disclosure or in the related art, drawings to be used in the descriptions of the embodiments will be briefly described hereinafter. Apparently, the drawings described hereinafter are only some drawings of the present disclosure, and other drawings can be obtained by persons of ordinary skill in the art based on these drawings without any creative effort.

DETAILED DESCRIPTION OF THE EMBODIMENTS

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

All transistors adopted in the embodiments of the present disclosure may be TFTs, field effect transistors (FETs) or any other elements having an identical characteristic. In order to differentiate two electrodes other than a gate electrode from each other, one of the two electrodes is called as first electrode and the other is called as second electrode. In actual use, the first electrode may be a drain electrode while the second electrode may be a source electrode, or the first electrode may be a source electrode while the second electrode may be a drain electrode.

In the embodiments of the present disclosure, each pixel sub-circuitry may be a subpixel.

In some embodiments of the present disclosure, each pixel sub-circuitry may be an OLED pixel sub-circuitry.

In some embodiments of the present disclosure, when a master control circuitry determines that a grayscale voltage is within a high grayscale voltage range, a selected gain capacitive sub-circuitry may have a larger capacitance, and when the master control circuitry determines that the grayscale voltage is within a low grayscale voltage range, the selected gain capacitive sub-circuitry may have a smaller capacitance.

In some embodiments of the present disclosure, with respect to optical signals from the pixel sub-circuitries having spectra at different wavelengths, the gain capacitive sub-circuitries corresponding to different brightness ranges may have different capacitances, and values of the capacitances may be selected according to the practical need.

In some embodiments of the present disclosure, an electrical signal detection module may be included in a pixel compensation circuitry. The pixel compensation circuitry may further include a compensation control sub-circuitry connected to a read line and configured to compensate for the grayscale voltage across a corresponding data line in accordance with an electrical signal read from the read line within a reading time period.

Figure 1:
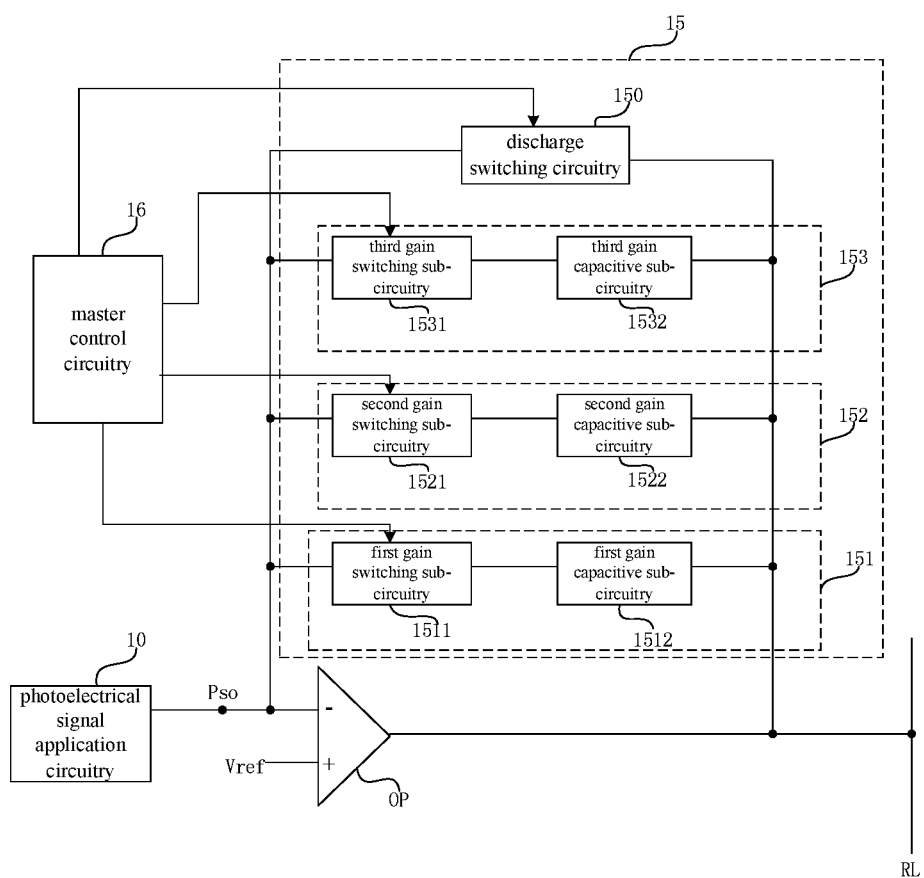
FIG. 1 is a schematic view showing an electrical signal detection module according to some embodiments of the present disclosure.

As shown in FIG. 1, the present disclosure provides in some embodiments an electrical signal detection module for use in a pixel compensation circuitry. Each pixel sub-circuitry is configured to drive a light-emitting element, and the pixel compensation circuitry includes a read line RL. The electrical signal detection module includes a photoelectrical signal application circuitry 10, an operational amplifier OP, a gain control circuitry 15 and a master control circuitry 16.

The photoelectrical signal application circuitry 10 includes a photoelectrical signal output end Pso. The photoelectrical signal application circuitry 10 is configured to apply an electrical signal corresponding to an optical signal from the light-emitting element via the photoelectrical signal output end Pso.

The operational amplifier OP includes a positive phase input end connected to a reference voltage input end for applying a reference voltage Vref and configured to receive the reference voltage Vref, a negative phase input end connected to the photoelectrical signal output end Pso and an output end connected to the read line RL.

The gain control circuitry 15 includes a first gain control sub-circuitry 151, a second gain control sub-circuitry 152 and a third gain control sub-circuitry 153, and a discharge switching sub-circuitry 150 connected in parallel to the first gain control sub-circuitry 151.

The first gain control sub-circuitry 151 includes a first gain switching sub-circuitry 1511 and a first gain capacitive sub-circuitry 1512 connected in series to each other.

A first end of the first gain switching sub-circuitry 1511 is connected to the negative phase input end, a second end of the first gain switching sub-circuitry 1511 is connected to a first end of the first gain capacitive sub-circuitry 1512, a second end of the first gain capacitive sub-circuitry 1512 is connected to the output end, and a control end of the first gain switching sub-circuitry 1511 is connected to the master control circuitry 16.

The second gain control sub-circuitry 152 includes a second gain switching sub-circuitry 1521 and a second gain capacitive sub-circuitry 1522 connected in series to each other.

A first end of the second gain switching sub-circuitry 1521 is connected to the negative phase input end, a second end of the second gain switching sub-circuitry 1521 is connected to a first end of the second gain capacitive sub-circuitry 1522, a second end of the second gain capacitive sub-circuitry 1522 is connected to the output end, and a control end of the second gain switching sub-circuitry 1521 is connected to the master control circuitry 16.

The third gain control sub-circuitry 153 includes a third gain switching sub-circuitry 1531 and a third gain capacitive sub-circuitry 1532 connected in series to each other.

A first end of the third gain switching sub-circuitry 1531 is connected to the negative phase input end, a second end of the third gain switching sub-circuitry 1531 is connected to a first end of the third gain capacitive sub-circuitry 1532, a second end of the third gain capacitive sub-circuitry 1532 is connected to the output end, and a control end of the third gain switching sub-circuitry 1531 is connected to the master control circuitry 16.

The first, second, and third gain capacitive sub-circuitries 1512, 1522 and 1532 may have different capacitances.

A control end of the discharge switching sub-circuitry 150 is connected to the master control circuitry 16. The master control circuitry 16 is configured to apply a gain switching control signal to each of the first gain switching sub-circuitry 1511, the second gain switching sub-circuitry 1521 or the third gain switching sub-circuitry 1531 in accordance with a grayscale voltage applied to the pixel sub-circuitry, so as to enable the first end and the second end of the corresponding gain switching sub-circuitry to be electrically connected to each other.

The master control circuitry 16 is further configured to apply a discharge switching signal to the discharge switching sub-circuitry 150. The discharge switching sub-circuitry 150 is configured to control the first end of each gain capacitive sub-circuitry connected to the gain switching sub-circuitry to be electrically connected to, or electrically disconnected from, the second end of the gain capacitive sub-circuitry in accordance with the discharge switching signal.

In some embodiments of the present disclosure, the capacitance of the first gain capacitive sub-circuitry 1512 is smaller than the capacitance of the second gain capacitive sub-circuitry 1522, and the capacitance of the second gain capacitive sub-circuitry 1522 is smaller than the capacitance of the third gain capacitive sub-circuitry 1532.

In some embodiments of the present disclosure, depending on values of the grayscale voltages, there are three grayscale voltage ranges, i.e., a low grayscale voltage range, an intermediate grayscale voltage range, and a high grayscale voltage range which do not overlap each other.

When the master control circuitry 16 determines that the grayscale voltage is within the low grayscale voltage range, it may control the first end and the second end of the first gain switching sub-circuitry 1511 to be electrically connected to each other, so as to enable the first gain capacitive sub-circuitry 1512 to be electrically connected between the negative phase input end and the output end of the operational amplifier OP.

When the master control circuitry 16 determines that the grayscale voltage is within the intermediate grayscale voltage range, it may control the first end and the second end of the second gain switching sub-circuitry 1521 to be electrically connected to each other, so as to enable the second gain capacitive sub-circuitry 1522 to be electrically connected between the negative phase input end and the output end of the operational amplifier OP.

When the master control circuitry 16 determines that the grayscale voltage is within the high grayscale voltage range, it may control the first end and the second end of the third gain switching sub-circuitry 1531 to be electrically connected to each other, so as to enable the third gain capacitive sub-circuitry 1532 to be electrically connected between the negative phase input end and the output end of the operational amplifier OP.

In the embodiments of the present disclosure, the gain control circuitry may also include two, four, five or more gain control sub-circuitries, and the number of the gain control sub-circuitries may be set in accordance with the practical need. Each gain control sub-circuitry may correspond to one grayscale voltage range.

During the operation of the electrical signal detection module in FIG. 1, a reading time period and a discharging time period prior to the reading time period may be provided.

Within the discharging time period, the master control circuitry 16 may apply the gain switching control signal to the corresponding gain switching sub-circuitry in accordance with the grayscale voltage applied to the pixel sub-circuitry, so as to enable the first end and the second end of the gain switching sub-circuitry to be electrically connected to each other. For example, when the grayscale voltage is within the low grayscale voltage range, the corresponding gain switching sub-circuitry may be the first gain switching sub-circuitry 1511; when the grayscale voltage is within the intermediate grayscale voltage range, the corresponding gain switching sub-circuitry may be the second gain switching sub-circuitry 1521; and when the grayscale voltage is within the high grayscale voltage range, the corresponding gain switching sub-circuitry may be the third gain switching sub-circuitry 1531.

Within the discharging time period, the master control circuitry 16 may apply the discharge switching signal to the discharge switching sub-circuitry 150, so as to control the discharge switching sub-circuitry 150 to enable the first end and the second end of the gain capacitive sub-circuitry connected to the corresponding gain switching sub-circuitry to be electrically connected to each other, thereby to release charges stored in the gain capacitive sub-circuitry. For example, when the grayscale voltage is within the low grayscale voltage range, within the discharging time period, the discharge switching sub-circuitry 150 may enable the first end and the second end of the first gain capacitive sub-circuitry 1512 to be electrically connected to each other, so as to release charges stored in the first gain capacitive sub-circuitry 1512; when the grayscale voltage is within the intermediate grayscale voltage range, within the discharging time period, the discharge switching sub-circuitry 150 may enable the first end and the second end of the second gain capacitive sub-circuitry 1522 to be electrically connected to each other, so as to release charges stored in the second gain capacitive sub-circuitry 1522; and when the grayscale voltage is within the high grayscale voltage range, within the discharging time period, the discharge switching sub-circuitry 150 may enable the first end and the second end of the third gain capacitive sub-circuitry 1532 to be electrically connected to each other, so as to release charges stored in the third gain capacitive sub-circuitry 1532.

Within the reading time period, the master control circuitry 16 may control the discharge switching sub-circuitry 150 to enable the first end and the second end of the gain capacitive sub-circuitry connected to the corresponding gain switching sub-circuitry to be electrically disconnected from each other, and the master control circuitry 16 may apply the gain switching control signal to the corresponding gain switching sub-circuitry in accordance with the grayscale voltage applied to the pixel sub-circuitry so as to enable the first end and the second end of the gain switching sub-circuitry to be electrically connected to each other.

According to the embodiments of the present disclosure, the discharging time period may be provided prior to the reading time period, and within the charging time period, the master control circuitry may apply the discharge switching signal to the discharge switching sub-circuitry, so as to control the discharge switching sub-circuitry to enable the first end and the second end of the gain capacitive sub-circuitry connected to the corresponding gain switching sub-circuitry to be electrically connected to each other, thereby to release the charges stored in the gain capacitive sub-circuitry. As a result, it is able to prevent, within the reading time period, the electrical signal applied to the read line from being adversely affected by the residual charges in the gain capacitive sub-circuitry, thereby to perform the compensation operation accurately.

Figure 2:
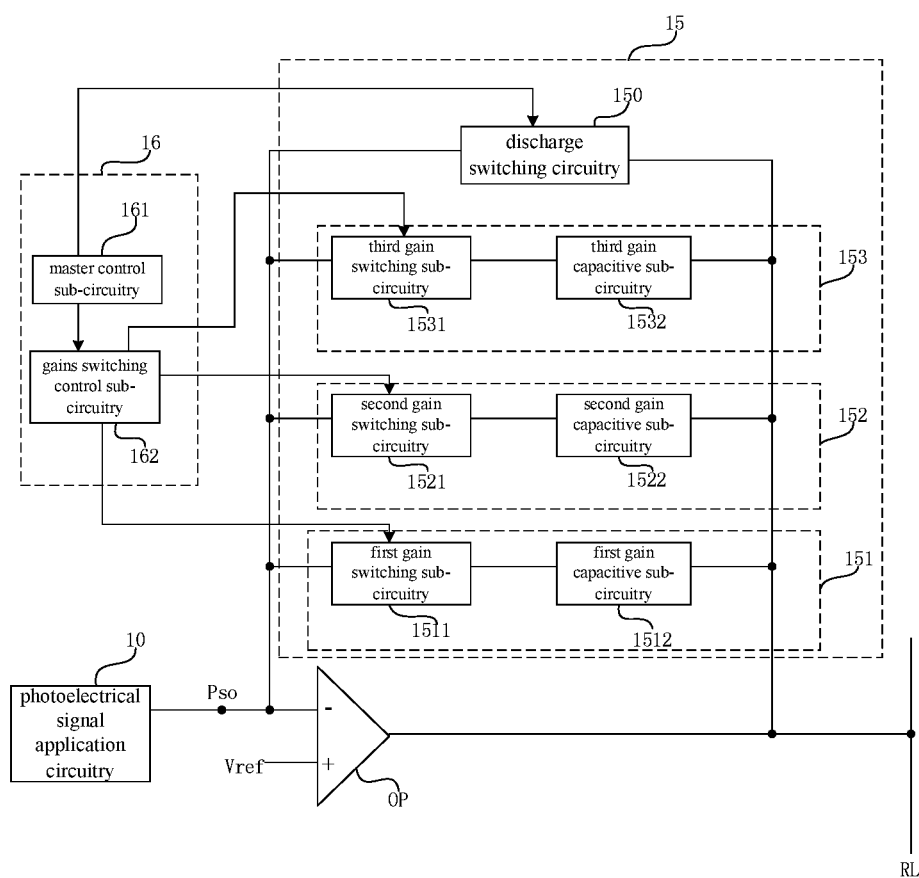
FIG. 2 is another schematic view showing the electrical signal detection module according to some embodiments of the present disclosure.

In some possible embodiments of the present disclosure, as shown in FIG. 2, the master control circuitry may include a master control sub-circuitry 161 and a gain switching control sub-circuitry 162.

The master control sub-circuitry 161 is configured to acquire grayscale voltage information so as to generate the discharge switching signal, and transmit the discharge switching signal to the discharge switching circuitry 150. The grayscale voltage information is information indicating a voltage range within which the grayscale voltage applied to the pixel sub-circuitry (the pixel sub-circuitry is a pixel sub-circuitry corresponding to the electrical signal detection module, and the photoelectrical signal application circuitry of the electrical signal detection module may apply the electrical signal in accordance with an optical signal from the pixel sub-circuitry) is located.

The gain switching control sub-circuitry 162 is connected to the master control sub-circuitry 161 and configured to apply the gain switching control signal to the corresponding gain switching sub-circuitry in accordance with the grayscale voltage information, so as to enable the first end and the second end of the gain switching sub-circuitry to be electrically connected to each other.

For the electrical signal detection module in the embodiments of the present disclosure, through the master control circuitry, it is able to control the first end and the second end of one of the gain switching sub-circuitries to be electrically connected to each other in accordance with the grayscale voltage, so as to dynamically adjust the gain in accordance with the capacitance of the corresponding gain capacitive sub-circuitry, thereby to perform the compensation operation accurately with respect to the images having different brightness values.

For the electrical signal detection module in the embodiments of the present disclosure, through the additional operational amplifier, the gain control circuitry (which includes a plurality of gain control sub-circuitries connected in parallel to each other and the discharge switching sub-circuitry connected in parallel to the gain control sub-circuitries, and each gain control sub-circuitry includes the gain switching sub-circuitry and the gain capacitive sub-circuitry connected in series to each other) and the master control circuitry, it is able to dynamically adjust the gain in accordance with the grayscale voltage, thereby to perform the compensation operation accurately with respect to the images having spectra at different wavelengths and having different brightness values. In this way, it is able to effectively improve the compensation accuracy and capability of the pixel compensation circuitry and provide an excellent compensation scheme, thereby to improve the display quality and service life of the pixel sub-circuitry.

In the embodiments of the present disclosure, the discharge switching sub-circuitry of the gain control circuitry is configured to, within the discharging time period prior to the reading time period, control the first end and the second end of the gain capacitive sub-circuitry connected to the corresponding gain switching sub-circuitry to be electrically connected to each other (the gain capacitive sub-circuitry is connected to the gain switching sub-circuitry whose first end and second end has been electrically connected to each other), so as to release the charges stored in the gain capacitive sub-circuitry. As a result, it is able to prevent the electrical signal applied to the read line from being adversely affected due to the residual charges in the gain capacitive sub-circuitry within the reading time period, thereby to perform the compensation operation accurately.

In some embodiments of the present disclosure, the master control circuitry may include the master control sub-circuitry 161 and the gain switching control sub-circuitry 162. The master control sub-circuitry 161 may acquire the information about the voltage range within which the grayscale voltage is located, and then the gain switching control sub-circuitry 162 may control the first end and the second end of the corresponding gain switching sub-circuitry to be electrically connected to each other in accordance with the information, so as to select the capacitance of the gain capacitive sub-circuitry.

During the operation of the electrical signal detection module in FIG. 2, when the master control circuitry 16 applies the gain switching control signal to the corresponding gain switching sub-circuitry in accordance with the grayscale voltage applied to the pixel sub-circuitry so as to enable the first end and the second end of the gain switching sub-circuitry to be electrically connected to each other, a specific operation procedure will be described hereinafter.

The master control sub-circuitry 161 may acquire the grayscale voltage information so as to generate the discharge switching signal, and apply the discharge switching signal to the discharge switching sub-circuitry 150. The grayscale voltage information may be the information indicating the voltage range within which the grayscale voltage applied to the pixel sub-circuitry is located. Then, the gain switching control sub-circuitry 162 may apply the gain switching control signal to the corresponding gain switching sub-circuitry in accordance with the grayscale voltage information, so as to enable the first end and the second end of the gain switching sub-circuitry to be electrically connected to each other.

During the implementation, the grayscale voltage information may include first grayscale voltage information and second grayscale voltage information. The first grayscale voltage information may be information indicating that the grayscale voltage is located within a first voltage range. In some embodiments of the present disclosure, first grayscale voltage information may correspond to the low grayscale voltage range. The second grayscale voltage information may be information indicating that the grayscale voltage is within a second voltage range. In some embodiments of the present disclosure, the second grayscale voltage information may correspond to the intermediate grayscale voltage range. The first voltage range may be greater than a first predetermined voltage and smaller than a second predetermined voltage, and the second voltage range may be greater than a third predetermined voltage and smaller than a fourth predetermined voltage. The first predetermined voltage may be smaller than the second predetermined voltage, and the third predetermined voltage may be smaller than the fourth predetermined voltage and greater than the second predetermined voltage.

When the grayscale voltage information acquired by the master control sub-circuitry 161 is the first grayscale voltage information, the gain switching control sub-circuitry 162 may apply a first gain switching control signal to the first gain switching sub-circuitry 1511 in accordance with the first grayscale voltage information, so as to enable the first end and the second end of the first gain switching sub-circuitry 1511 to be electrically connected to each other.

When the grayscale voltage information acquired by the master control sub-circuitry 161 is the second grayscale voltage information, the gain switching control sub-circuitry 162 may apply a second gain switching control signal to the second gain switching sub-circuitry 1521 in accordance with the first grayscale voltage information, so as to enable the first end and the second end of the second gain switching sub-circuitry 1521 to be electrically connected to each other.

The first gain capacitive sub-circuitry 1512 may have a capacitance smaller than the second gain capacitive sub-circuitry 1522. The first gain capacitive sub-circuitry 1512 may be connected in series to the first gain switching sub-circuitry 1511, and the second gain capacitive sub-circuitry 1522 may be connected in series to the second gain switching sub-circuitry 1521.

In other words, when the grayscale voltage applied to the corresponding pixel sub-circuitry is relatively large, the corresponding gain capacitive sub-circuitry may have a relatively large capacitance, and when the grayscale voltage applied to the corresponding pixel sub-circuitry is relatively small, the corresponding gain capacitive sub-circuitry may have a relatively small capacitance.

Figure 3:
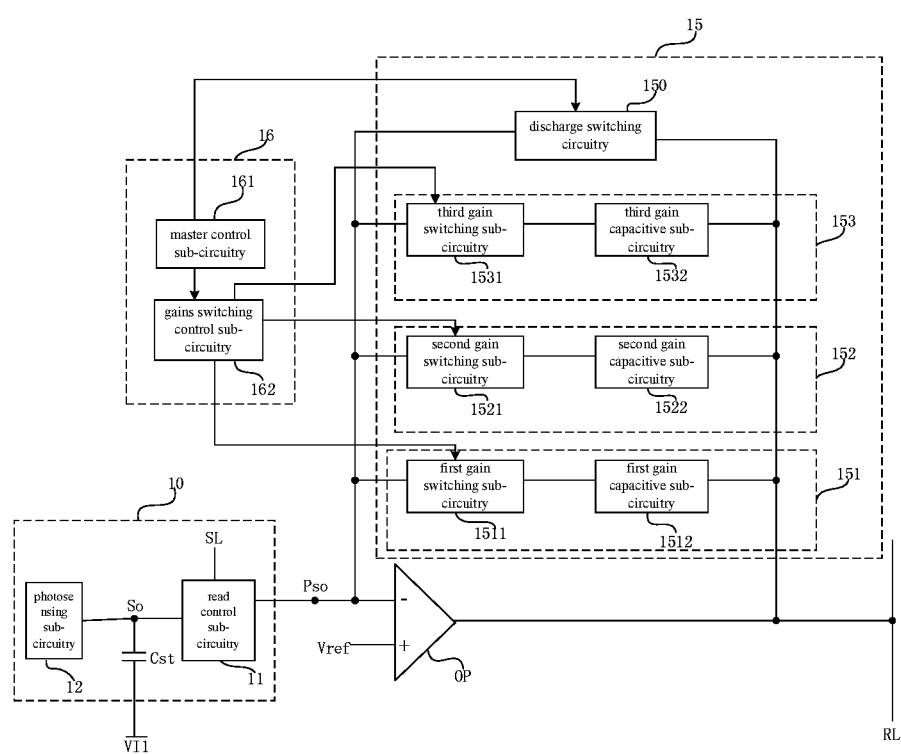
FIG. 3 is yet another schematic view showing the electrical signal detection module according to some embodiments of the present disclosure.

As shown in FIG. 3, the photoelectrical signal application circuitry 10 may include a read control sub-circuitry 11, a photosensing sub-circuitry 12 and a storage capacitor Cst.

The photosensing sub-circuitry 12 may include a photosensing output end So. The photosensing sub-circuitry 12 is configured to convert the optical signal from the corresponding pixel sub-circuitry into an electrical signal, and output the electrical signal via the photosensing output end So.

A first end of the storage capacitor Cst may be connected to the photosensing output end So, and a second end of the storage capacitor Cst may be connected to a first voltage input end VII.

A first end of the read control sub-circuitry 11 may be connected to the photosensing output end So, a second end of the read control sub-circuitry 11 may be connected to the negative phase input end of the operational amplifier OP, and a control end of the read control sub-circuitry 11 may be connected to a read control line SL. The read control sub-circuitry 11 is configured to, under the control of a read control signal, control the photosensing output end So to be electrically connected to, or electrically disconnected from, the negative phase input end of the operational amplifier OP. The read control signal may be applied via the read control line SL. The second end of the read control sub-circuitry 11 may also be the photoelectrical signal output end Pso of the photoelectrical signal application circuitry 10.

In some embodiments of the present disclosure, VII may be, but not limited to, a low voltage input end or a grounded end, i.e., the type of VII may be selected in accordance with the practical need.

In some embodiments of the present disclosure, a photoelectric conversion procedure will be described as follows. At first, within a resetting time period, a voltage applied to the first end of the storage capacitor may be reset, so as to empty the charges stored in the storage capacitor. Next, within an integration time period, the photosensing sub-circuitry may convert the optical signal into the electrical signal, and store the electrical signal in the storage capacitor. Then, within the reading time period, the read control sub-circuitry may control the photosensing sub-circuitry to be electrically connected to the operational amplifier, so as to transfer the electrical signal acquired by the photosensing sub-circuitry to the corresponding gain capacitive sub-circuitry via the operational amplifier, and enable the operational amplifier to amplify the electrical signal and output the amplified electrical signal to the other processing circuit for subsequent processing, thereby to collect a display grayscale brightness value in real time.

Within the resetting time period, under the control of the read control signal, the read control sub-circuitry may control the second end of the storage capacitor to be electrically connected to the negative phase input end of the operational amplifier, so as to enable a voltage across the read line to be a low level, thereby to reset a voltage applied to the second end of the storage capacitor.

Figure 4:
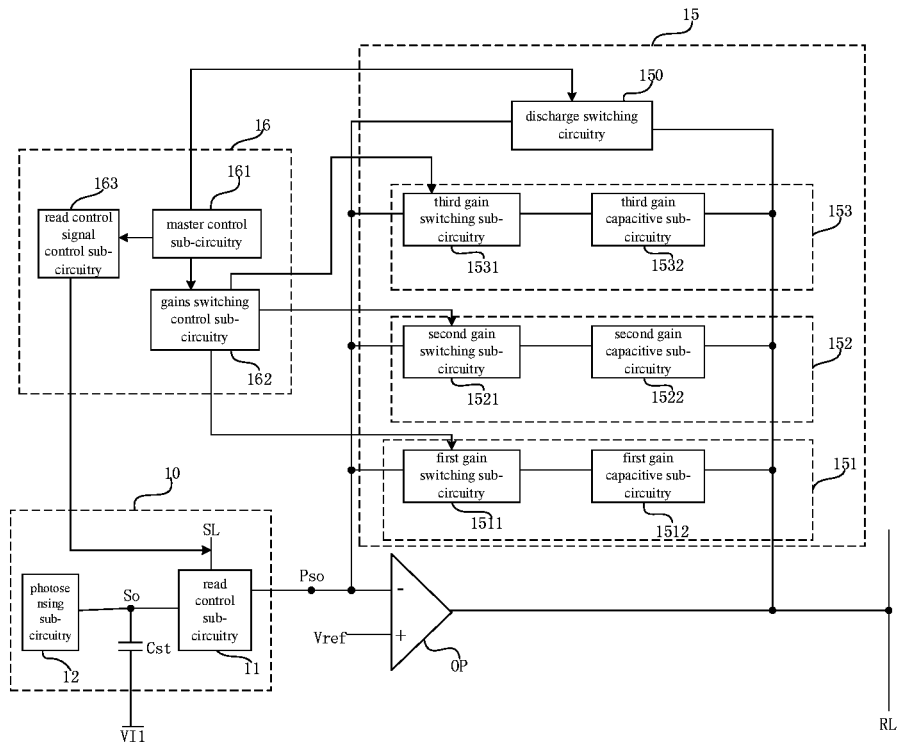
FIG. 4 is still yet another schematic view showing the electrical signal detection module according to some embodiments of the present disclosure.

During the implementation, as shown in FIG. 4, the master control circuitry may further include a read control signal control sub-circuitry 163 connected to the master control sub-circuitry 161 and configured to generate the read control signal in accordance with the grayscale voltage information and transmit the read control signal to the read control line SL.

Figure 5:
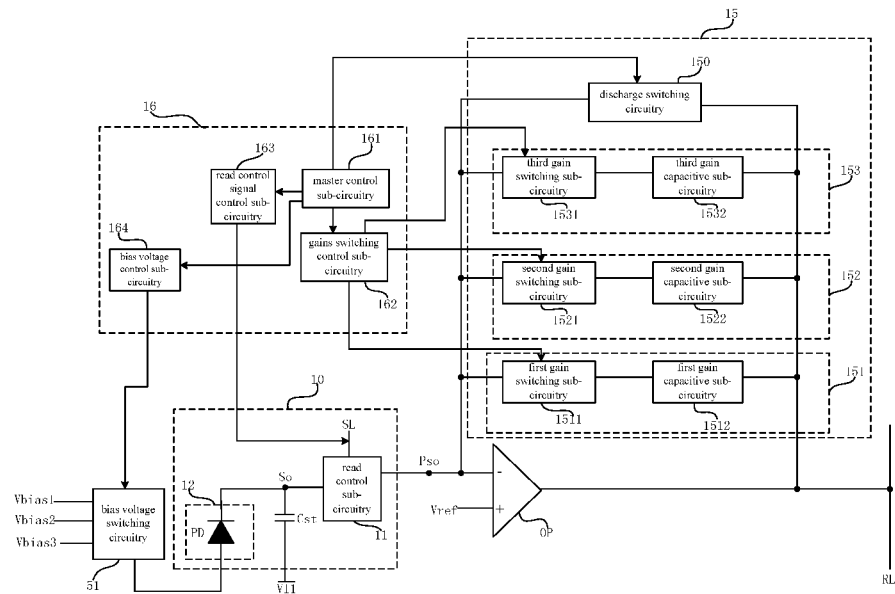
FIG. 5 is still yet another schematic view showing the electrical signal detection module according to some embodiments of the present disclosure.

In some possible embodiments of the present disclosure, as shown in FIG. 5, the electrical signal detection module may further include a first voltage-adjustable input end configured to apply a first adjustable voltage Vbias1, a second voltage-adjustable input end configured to apply a second adjustable voltage Vbias2 and a third voltage-adjustable input end configured to apply a third adjustable voltage Vbias3.

The photosensing sub-circuitry 12 may include photosensitive diode PD, a cathode of which is connected to the first end of the storage capacitor Cst. The electrical signal detection module may further include a bias voltage switching circuitry 51, and the master control circuitry 16 may further include a bias voltage control sub-circuitry 164. An anode of the photosensitive diode PD may be connected to the first voltage-adjustable input end, the second voltage-adjustable input end and the third voltage-adjustable input end via the bias voltage switching circuitry 51. A control end of the bias voltage switching circuitry 51 may be connected to the bias voltage control sub-circuitry 164. The bias voltage control sub-circuitry 164 is configured to apply a bias voltage control signal to the bias voltage switching circuitry 51 in accordance with the grayscale voltage information, so as to enable the corresponding voltage-adjustable input end to be electrically connected to the anode of the photosensitive diode PD.

In some embodiments of the present disclosure, when the photosensitive diode is capable of sensing an optical signal, the photosensitive diode may be in a reverse biased state. Usually, at this time the adjustable voltage applied by each voltage-adjustable input end may be a negative voltage. When the adjustable voltage is the negative voltage and the grayscale voltage applied to the corresponding pixel sub-circuitry is relatively large, an absolute value of the corresponding adjustable voltage may be smaller, and when the grayscale voltage applied to the corresponding pixel sub-circuitry is relatively small, the absolute value of the corresponding adjustable voltage may be larger.

Figure 6:
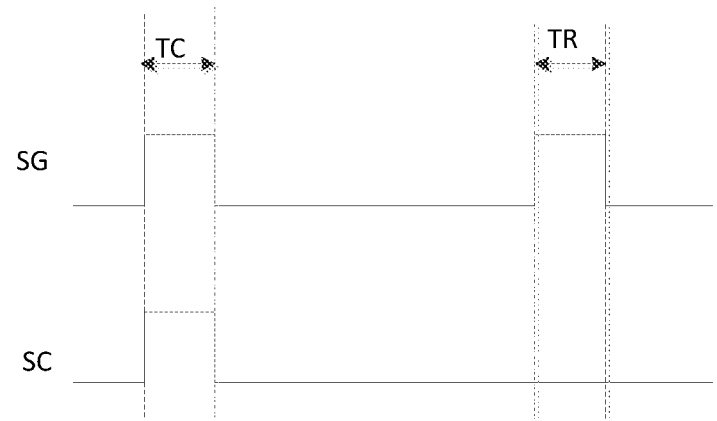
FIG. 6 is a sequence diagram of a method for driving the electrical signal detection module according to some embodiments of the present disclosure.

The present disclosure further provides in some embodiments a method for driving the above-mentioned electrical signal detection module, as shown in FIG. 6. A discharging time period TC is arranged prior to a reading time period TR. The method includes: setting the reading time period TR and the discharging time period TC prior to the reading time period TR; applying, by a master control circuitry within the discharging time period TC and the reading time period TR, a gain switching control signal SG to a corresponding gain switching sub-circuitry in accordance with a grayscale voltage applied to a pixel sub-circuitry, so as to enable a first end of the gain switching sub-circuitry to be electrically connected to a second end of the gain switching sub-circuitry; applying, by the master control circuitry within the discharging time period TC, a discharge switching signal SC to a discharge switching sub-circuitry, so as to control the discharge switching sub-circuitry to enable a first end of a gain capacitive sub-circuitry connected to the gain switching sub-circuitry to be electrically connected to a second end of the gain capacitive sub-circuitry, thereby to release charges stored in the gain capacitive sub-circuitry; and controlling, by the master control circuitry within the reading time period TR, the discharge switching sub-circuitry to enable the first end of the gain capacitive sub-circuitry to be electrically disconnected from the second end of the gain capacitive sub-circuitry.

For the driving method in the embodiments of the present disclosure, through the master control circuitry, it is able to control the first end and the second end of one of the gain switching sub-circuitries to be electrically connected to each other in accordance with the grayscale voltage, so as to dynamically adjust the gain in accordance with the capacitance of the corresponding gain capacitive sub-circuitry, thereby to perform the compensation operation accurately with respect to the images having different brightness values.

In some embodiments of the present disclosure, the discharging time period may be arranged prior to the reading time period, and within the discharging time period, the master control circuitry may apply the discharge switching signal to the discharge switching sub-circuitry, so as to control the discharge switching sub-circuitry to enable the first end and the second end of the gain capacitive sub-circuitry connected to the gain switching sub-circuitry to be electrically connected to each other, thereby to release the charges stored in the gain capacitive sub-circuitry. As a result, it is able to prevent the electrical signal applied to the read line from being adversely affected due to the residual charges in the gain capacitive sub-circuitry within the reading time period, thereby to perform the compensation operation accurately.

Figure 7:
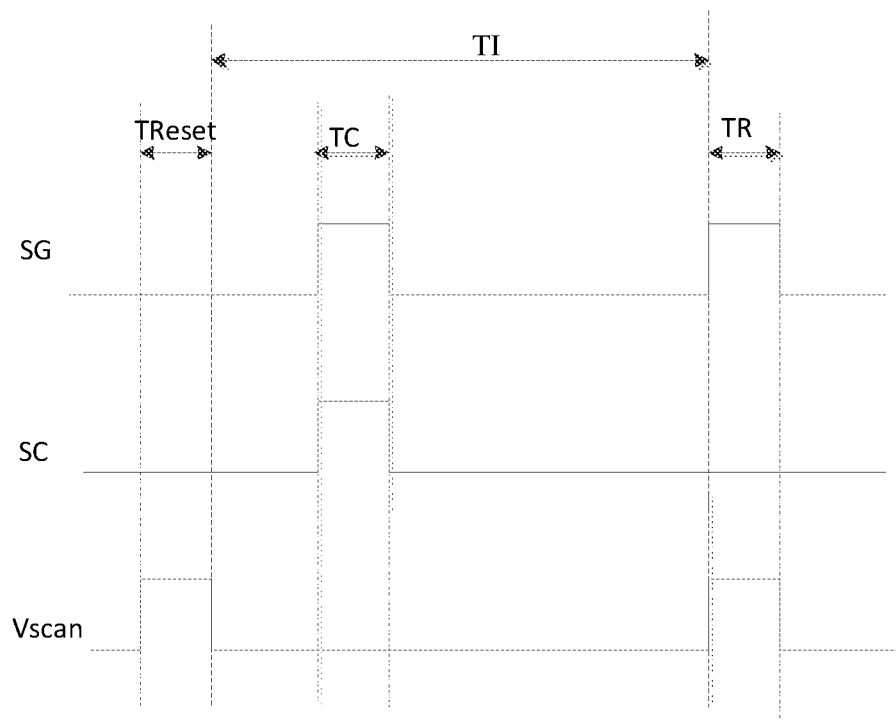
FIG. 7 is another sequence diagram of the method for driving the electrical signal detection module according to some embodiments of the present disclosure.

In some embodiments of the present disclosure, the photoelectrical signal application circuitry may include a photosensing sub-circuitry, a read control sub-circuitry and a storage capacitor. As shown in FIG. 7, a resetting time period TReset may be arranged prior to the reading time period TR, an integration time period TI may be arranged between the resetting time period TReset and the reading time period TR, and the discharging time period TC may be arranged between TReset and TR, i.e., the integration time period TI may include the discharging time period TC. The driving method may further include: within the resetting time period TReset, resetting a voltage applied to a first end of the storage capacitor, so as to empty charge signals stored in the storage capacitor; within the integration time period TI, converting, by the photosensing sub-circuitry, an optical signal from the pixel sub-circuitry into an electrical signal, and storing the electrical signal into the storage capacitor; and within the reading time period TR, under the control of the read control signal Vscan, controlling, by the read control sub-circuitry, the first end of the storage capacitor to be electrically connected to the negative input end of the operational amplifier, so as to enable the operational amplifier to apply a voltage signal corresponding to the electrical signal acquired by the photosensing sub-circuitry to the read line. An integration time corresponding to the read control signal Vscan may be a duration of the integration time period TI.

In some embodiments of the present disclosure, a first integration time corresponding to a first read control signal may be greater than a second integration time corresponding to a second read control signal. The first read control signal may be a read control signal corresponding to first grayscale voltage information, and the second read control signal may be a read control signal corresponding to second grayscale voltage information.

During the implementation, within the resetting time period TReset, under the control of the read control signal Vscan, the read control sub-circuitry may control the first end of the storage capacitor to be electrically connected to the negative input end of the operational amplifier.

In some embodiments of the present disclosure, when the grayscale voltage applied to the corresponding pixel sub-circuitry is relatively large, the integration time may be smaller, and when the grayscale voltage applied to the corresponding pixel sub-circuitry is relatively small, the integration time may be larger.

In some embodiments of the present disclosure, the electrical signal detection module may further include at least two voltage-adjustable input ends. The photosensing sub-circuitry may include a photosensitive diode, an anode of which is connected to the voltage-adjustable input ends, and a cathode of which is connected to the first end of the storage capacitor. The electrical signal detection module may further include a bias voltage switching circuitry, and the master control circuitry may further include a bias voltage control sub-circuitry. The anode of the photosensitive diode may be connected to at least two voltage-adjustable input ends via the bias voltage switching circuitry and a control end of the bias voltage switching circuitry may be connected to the bias voltage control sub-circuitry. The driving method may further include applying, by the bias voltage control sub-circuitry, a bias voltage control signal to the bias voltage switching circuitry in accordance with the grayscale voltage information, so as to enable the corresponding voltage-adjustable input end to be electrically connected to the anode of the photosensitive diode.

To be specific, an absolute value of a first adjustable voltage applied by a first voltage-adjustable input end may be greater than an absolute value of a second adjustable voltage applied by a second voltage-adjustable input end. The first adjustable voltage may be an adjustable voltage applied by the voltage-adjustable input end corresponding to the first grayscale voltage information, and the second adjustable voltage may be an adjustable voltage applied by the voltage-adjustable input end corresponding to the second grayscale voltage information.

In some embodiments of the present disclosure, usually the first adjustable voltage and the second adjustable voltage are each a negative voltage. When the grayscale voltage applied to the corresponding pixel sub-circuitry is relatively large, the absolute value of the corresponding adjustable voltage may be smaller, and when the grayscale voltage is relatively small, the absolute value of the corresponding adjustable voltage may be greater.

The present disclosure further provides in some embodiments a pixel circuit including a plurality of pixel unit circuitries arranged in rows and columns. Each pixel unit circuitry includes a pixel sub-circuitry and a pixel compensation circuitry, the pixel compensation circuitry includes the above-mentioned electrical signal detection module, and the pixel unit circuitries in a same column are connected to a same read line.

The present disclosure further provides in some embodiments a display device including the above-mentioned pixel circuit and a grayscale voltage determination circuit. The grayscale voltage determination circuit is configured to acquire a grayscale voltage applied to each pixel sub-circuitry, determine a voltage range within which the grayscale voltage is located, and generate grayscale voltage information indicating the voltage range within which the grayscale voltage applied to the pixel sub-circuitry is located.

In some embodiments of the present disclosure, a grayscale voltage determination sub-circuit may be adopted to determine the voltage range within which the grayscale voltage is located.

During the implementation, the grayscale voltage determination sub-circuit may be arranged in a driver integrated circuit (IC) of the display device.

During the display compensation, at first the driver IC may divide the grayscale voltage information about to-be-displayed image data from an application processor (AP) into high grayscale voltage information, intermediate grayscale voltage information and low grayscale voltage information, and then transmit the grayscale voltage information to a dynamic optical detection system (which may include the electrical signal detection modules arranged in rows and columns). Then, the photosensing sub-circuitry of the dynamic optical detection system may dynamically adjust a gain capacitance, the integration time and a driving voltage (i.e., the adjustable voltage) in real time in accordance with response characteristics of different spectrum components, so as to determine a luminescent property of the light-emitting element in real time, thereby to compensate for the display data in real time.

Figure 8:
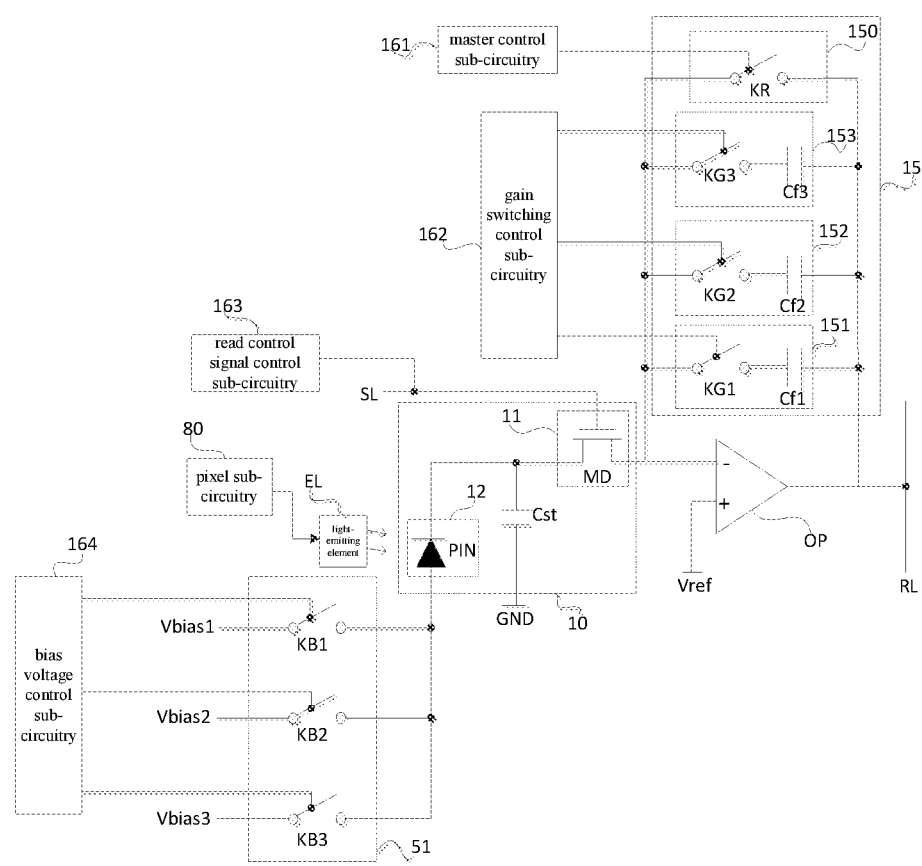
FIG. 8 is a circuit diagram of the electrical signal detection module according to some embodiments of the present disclosure.

As shown in FIG. 8, the present disclosure provides in some embodiments an electrical signal detection module for use in a pixel compensation circuitry, and each pixel sub-circuitry 80 is configured to drive a light-emitting element EL to emit light. The electrical signal detection module includes a photoelectrical signal application circuitry 10, an operational amplifier OP, a gain control circuitry 15, a bias voltage switching circuitry 51 and a master control circuitry 16. The photoelectrical signal application circuitry 10 includes a read control sub-circuitry 11, a storage capacitor Cst and a photosensing sub-circuitry 12. The photosensing sub-circuitry 12 is configured to convert an optical signal from the corresponding light-emitting element EL into an electrical signal. The master control circuitry includes a master control sub-circuitry 161, a gain switching control sub-circuitry 162, a read control signal control sub-circuitry 163 and a bias voltage control sub-circuitry 164. The pixel compensation circuitry includes a read line RL and a compensation control sub-circuitry 90. The photosensing sub-circuitry 12 includes a photosensitive diode PIN, an anode of which is connected to a first voltage-adjustable input end for applying a first adjustable voltage Vbias1, a second voltage-adjustable input end for applying a second adjustable voltage Vbias2 and a third voltage-adjustable input end for applying a third adjustable voltage Vbias3 via the bias voltage switching circuitry 51.

The bias voltage switching circuitry 51 includes a first bias voltage switch KB1 connected between the first voltage-adjustable input end and the anode of the photosensitive diode PIN, a second bias voltage switch KB2 connected between the second voltage-adjustable input end and the anode of the photosensitive diode PIN, and a third bias voltage switch KB3 connected between the third voltage-adjustable input end and the anode of the photosensitive diode PIN. A control end of each of KB1, KB2 and KB3 is connected to the bias voltage control sub-circuitry 164.

The read control sub-circuitry 11 includes a read control transistor MD. A cathode of PIN is connected to a first end of Cst, and a second end of Cst is connected to the grounded end GND. A gate electrode of MD is connected to the read control line SL, a drain electrode of MD is connected to the first end of Cst, and a source electrode of MD is connected to a negative phase input end of the operational amplifier OP. The read control line SL is connected to the read control signal control sub-circuitry 163.

A positive phase input end of OP is connected to a reference voltage input end for applying a reference voltage Vref, and an output end of OP is connected to the read line RL. The gain control circuitry 15 includes a first gain control sub-circuitry 151, a second gain control sub-circuitry 152, a third gain control sub-circuitry 153 and a discharge switching sub-circuitry 150 connected in parallel to each other. The first gain control sub-circuitry 151 includes a first gain switch KG1 and a first gain capacitor Cf1 connected in series to each other. A first end of KG1 is connected to the negative phase input end, a second end of KG1 is connected to a first end of Cf1, a second end of Cf1 is connected to the output end, and a control end of KG1 is connected to the gain switching control sub-circuitry 162.

The second gain control sub-circuitry 152 includes a second gain switch KG2 and a second gain capacitor Cf2 connected in series to each other. A first end of KG2 is connected to the negative phase input end, a second end of KG2 is connected to a first end of Cf2, a second end of Cf2 is connected to the output end, and a control end of KG2 is connected to the gain switching control sub-circuitry 162.

The third gain control sub-circuitry 153 includes a third gain switch KG3 and a third gain capacitor Cf3 connected in series to each other. A first end of KG3 is connected to the negative phase input end, a second end of KG3 is connected to a first end of Cf3, a second end of Cf3 is connected to the output end, and a control end of KG3 is connected to the gain switching control sub-circuitry 162.

The discharge switching sub-circuitry 150 includes a discharge switch KR, a first end of which is connected to the negative phase input end, a second end of which is connected to the output end, and a control end of which is connected to the master control sub-circuitry 161.

In FIG. 8, MD is an N-type transistor. However, in actual use, MD may also be a P-type transistor, i.e., a type of the transistor will not be particularly defined herein.

During the operation of the electrical signal detection module in FIG. 8, the master control sub-circuitry 161 may acquire the grayscale voltage information so as to generate the discharge switching signal, and apply the discharge switching signal to KR, thereby to enable KR to be turned on within the discharging time period and turned off within the reading time period. In actual use, within the discharging time period and the reading time period, the gain switching control sub-circuitry 162 may apply the corresponding gain switching control signal to the corresponding gain switch, so as to control the gain switch to enable the first end of the gain capacitor connected to the gain switch to be electrically connected to the negative phase input end. In this way, within the discharging time period, the first end and the second of the gain capacitor may also be electrically connected to each other due to the KR in an ON state, thereby to release the residual charges in the gain capacitor.

The grayscale voltage information may be information indicating a voltage range within which the grayscale voltage applied to the pixel sub-circuitry 80 is located, and it may include high grayscale voltage information, intermediate grayscale voltage information and low grayscale voltage information.

When the grayscale voltage information is the low grayscale voltage information, the gain switching control sub-circuitry 162 may apply the corresponding gain switching control signal to KG1, so as to turn on KG1, thereby to enable Cf1 to be electrically connected between the negative phase input end and the output end of OP. In addition, when the grayscale voltage information is the low grayscale voltage information, the bias voltage control sub-circuitry 164 may apply the corresponding bias voltage control signal to KB1 in accordance with the grayscale voltage information, so as to enable the first voltage-adjustable input end for applying the first adjustable voltage Vbias1 to be electrically connected to the anode of PIN. Further, when the grayscale voltage information is the low grayscale voltage information, the read control signal control sub-circuitry 163 may generate a first read control signal, and apply the first read control signal to the read control line SL.

When the grayscale voltage information is the intermediate grayscale voltage information, the gain switching control sub-circuitry 162 may apply the corresponding gain switching control signal to KG2, so as to turn on KG2, thereby to enable Cf2 to be electrically connected between the negative phase input end and the output end of OP. In addition, when the grayscale voltage information is the intermediate grayscale voltage information, the bias voltage control sub-circuitry 164 may apply the corresponding bias voltage control signal to KB2 in accordance with the grayscale voltage information, so as to enable the second voltage-adjustable input end for applying the second adjustable voltage Vbias2 to be electrically connected to the anode of PIN. Further, when the grayscale voltage information is the intermediate grayscale voltage information, the read control signal control sub-circuitry 163 may generate a second read control signal, and apply the second read control signal to the read control line SL.

When the grayscale voltage information is the high grayscale voltage information, the gain switching control sub-circuitry 162 may apply the corresponding gain switching control signal to KG3, so as to turn on KG3, thereby to enable Cf3 to be electrically connected between the negative phase input end and the output end of OP. In addition, when the grayscale voltage information is the high grayscale voltage information, the bias voltage control sub-circuitry 164 may apply the corresponding bias voltage control signal to KB3 in accordance with the grayscale voltage information, so as to enable the third voltage-adjustable input end for applying the third adjustable voltage Vbias3 to be electrically connected to the anode of PIN. Further, when the grayscale voltage information is the high grayscale voltage information, the read control signal control sub-circuitry 163 may generate a third read control signal, and apply the third read control signal to the read control line SL.

Figure 9:
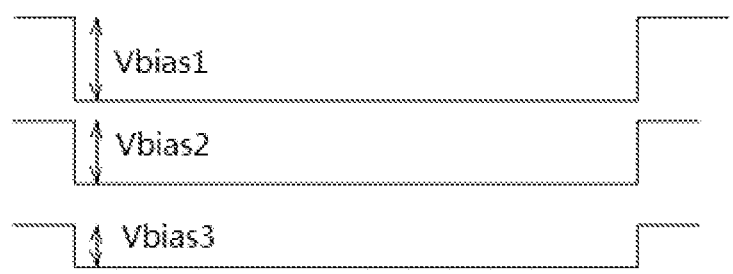
FIG. 9 is an oscillogram of adjustable voltages for the electrical signal detection module according to some embodiments of the present disclosure.

As shown in FIG. 9, Vbias1, Vbias2 and Vbias3 are all negative voltages, an absolute value of Vbias1 is greater than that of Vbias2, and an absolute value of Vbias2 is greater than that of Vbias3.

Figure 10:
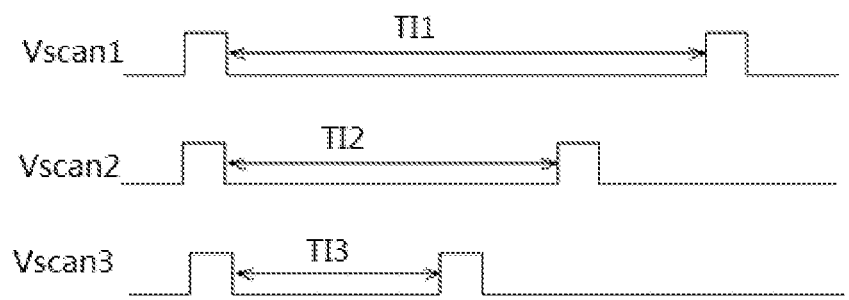
FIG. 10 is a sequence diagram of read control signals for the electrical signal detection module according to some embodiments of the present disclosure.

FIG. 10 show waveforms of a first read control signal Vscan1, a second read control signal Vscan2 and a third read control signal Vscan3. As shown in FIG. 10, a first integration time TB corresponding to Vscan1 is greater than an integration time TI2 corresponding to Vscan2, and TI2 is greater than a third integration time TI3 corresponding to Vscan3.

In some embodiments of the present disclosure, the discharging time period may be arranged subsequent to the resetting time period and prior to the reading time period. In FIG. 10, a time period within which each read control signal is at a high level for the first time may be the resetting time period, a time period within which each read control signal is at the high level for the second time may be the reading time period, and a time period between the resetting time period and the reading time period is the integration time period.

In FIG. 8, Cf1 has a capacitance smaller than Cf2, and Cf2 has a capacitance smaller than Cf3.

According to the electrical signal detection module in the embodiments of the present disclosure, the photoelectric conversion and detection may be achieved by the photosensing sub-circuitry (in FIG. 8, the photosensing sub-circuitry includes the photosensitive diode) in an integrated manner. Several dynamic photosensing driving voltages and dynamic integration capacitances may be provided with respect to different grayscale brightness values and different pixel sub-circuitries, and the integration time may be adjusted dynamically. Of course, through the photosensing sub-circuitry (which may include the photosensitive diode), it is able to selectively activate the gain control, the integration time control or the bias voltage control with respect to response characteristics of different spectra and different grayscale signals, and subject the signals to unified normalization processing on the basis of the properties of the photosensing sub-circuitry, so as to reproduce optical information about an original pixel. As a result, it is able effectively improve the detection capability and detection accuracy of the pixel compensation circuitry with respect to an OLED high-contrast image, reduce a design difficulty, and provide an excellent OLED dynamic optical compensation scheme, thereby to improve the display quality and service life of an OLED.

According to the electrical signal detection module, the driving method, the pixel circuit and the display device in the embodiments of the present disclosure, through the master control circuitry, it is able to control the first end and the second end of one of the gain switching sub-circuitries to be electrically connected to each other in accordance with the grayscale voltage, so as to dynamically adjust the gain in accordance with the capacitance of the corresponding gain capacitive sub-circuitry, thereby to perform the compensation operation accurately with respect to the images having different brightness values.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. An electrical signal detection module for use in a pixel compensation circuitry, wherein each pixel sub-circuitry is configured to drive a light-emitting element, and the pixel compensation circuitry comprises a read line, wherein
the electrical signal detection module comprises a photoelectrical signal application circuitry, an operational amplifier, a gain control circuitry and a master control circuitry;
the photoelectrical signal application circuitry comprises a photoelectrical signal output end;
the photoelectrical signal application circuitry is configured to apply an electrical signal corresponding to an optical signal from the light-emitting element via the photoelectrical signal output end;
the operational amplifier comprises a positive phase input end configured to receive a reference voltage, a negative phase input end connected to the photoelectrical signal output end and an output end connected to the read line;
the gain control circuitry comprises at least two levels of gain control sub-circuitries connected in parallel to each other and a discharge switching sub-circuitry connected in parallel to each gain control sub-circuitry, and each gain control sub-circuitry comprises a gain switching sub-circuitry and a gain capacitive sub-circuitry connected in series to each other;
a first end of the gain switching sub-circuitry is connected to the negative phase input end, a second end of the gain switching sub-circuitry is connected to a first end of the gain capacitive sub-circuitry, a second end of the gain capacitive sub-circuitry is connected to the output end, and the gain capacitive sub-circuitries of different gain control sub-circuitries have different capacitances;
the master control circuitry is configured to apply a discharge switching signal to the discharge switching sub-circuitry, and apply a gain switching control signal to the corresponding gain switching sub-circuitry in accordance with a grayscale voltage applied to the pixel sub-circuitry;
each gain switching sub-circuitry is configured to control the first end of the gain switching sub-circuitry to be electrically connected to the second end of the gain switching sub-circuitry in accordance with the gain switching control signal; and
the discharge switching sub-circuitry is configured to control the first end of each gain capacitive sub-circuitry connected to the gain switching sub-circuitry to be electrically connected to, or electrically disconnected from, the second end of the gain capacitive sub-circuitry in accordance with the discharge switching signal.

2. The electrical signal detection module according to claim 1, wherein
the master control circuitry comprises a master control sub-circuitry and a gain switching control sub-circuitry;
the master control sub-circuitry is configured to acquire grayscale voltage information so as to generate the discharge switching signal, and transmit the discharge switching signal to the discharge switching circuitry;
the grayscale voltage information is information indicating a voltage range within which the grayscale voltage applied to the pixel sub-circuitry is located; and
the gain switching control sub-circuitry is configured to apply the gain switching control signal to the corresponding gain switching sub-circuitry in accordance with the grayscale voltage information, so as to enable the first end and the second end of the gain switching sub-circuitry to be electrically connected to each other.

3. The electrical signal detection module according to claim 2, wherein
the photoelectrical signal application circuitry comprises a photosensing sub-circuitry, a read control sub-circuitry and a storage capacitor;
the photosensing sub-circuitry comprises a photosensing output end;
the photosensing sub-circuitry is configured to convert the optical signal from the corresponding pixel sub-circuitry into an electrical signal, and output the electrical signal via the photosensing output end;
a first end of the storage capacitor is connected to the photosensing output end, and a second end of the storage capacitor is connected to a first voltage input end;
a first end of the read control sub-circuitry is connected to the photosensing output end, and a second end of the read control sub-circuitry is connected to the negative phase input end of the operational amplifier; and
the read control sub-circuitry is configured to, under the control of a read control signal, control the photosensing output end to be electrically connected to, or electrically disconnected from, the negative phase input end of the operational amplifier.

4. The electrical signal detection module according to claim 3, wherein a control end of the read control sub-circuitry is connected to the read control line, and the master control circuitry further comprises a read control signal control sub-circuitry configured to generate the read control signal in accordance with the grayscale voltage information and transmit the read control signal to the read control line.

5. The electrical signal detection module according to claim 3, further comprising at least two voltage-adjustable input ends, wherein
the photosensing sub-circuitry comprises a photosensitive diode, a cathode of which is connected to the first end of the storage capacitor;
the electrical signal detection module further comprises a bias voltage switching circuitry, and the master control circuitry further comprises a bias voltage control sub-circuitry;
an anode of the photosensitive diode is connected to the at least two voltage-adjustable input ends via the bias voltage switching circuitry;
a control end of the bias voltage switching circuitry is connected to the bias voltage control sub-circuitry; and
the bias voltage control sub-circuitry is configured to apply a bias voltage control signal to the bias voltage switching circuitry in accordance with the grayscale voltage information, so as to enable the corresponding voltage-adjustable input end to be electrically connected to the anode of the photosensitive diode.

6. A method for driving the electrical signal detection module according to claim 1, comprising:
setting a reading time period and a discharging time period prior to the reading time period;
applying, by a master control circuitry within the discharging time period and the reading time period, a gain switching control signal to a corresponding gain switching sub-circuitry in accordance with a grayscale voltage applied to a pixel sub-circuitry, so as to enable a first end of the gain switching sub-circuitry to be electrically connected to a second end of the gain switching sub-circuitry;
applying, by the master control circuitry within the discharging time period, a discharge switching signal to a discharge switching sub-circuitry, so as to control the discharge switching sub-circuitry to enable a first end of a gain capacitive sub-circuitry connected to the gain switching sub-circuitry to be electrically connected to a second end of the gain capacitive sub-circuitry, thereby to release charges stored in the gain capacitive sub-circuitry; and
controlling, by the master control circuitry within the reading time period, the discharge switching sub-circuitry to enable the first end of the gain capacitive sub-circuitry to be electrically disconnected from the second end of the gain capacitive sub-circuitry.

7. The method according to claim 6, wherein the master control circuitry comprises a master control sub-circuitry and a gain switching control sub-circuitry,
wherein the applying, by the master control circuitry within the discharging time period and the reading time period, the gain switching control signal to the corresponding gain switching sub-circuitry in accordance with the grayscale voltage applied to the pixel sub-circuitry so as to enable the first end of the gain switching sub-circuitry to be electrically connected to the second end of the gain switching sub-circuitry comprises:
acquiring, by the master control sub-circuitry within the discharging time period and the reading time period, grayscale voltage information so as to generate the discharge switching signal, and applying the discharge switching signal to the discharge switching sub-circuitry, the grayscale voltage information being information indicating a voltage range within which the grayscale voltage applied to the pixel sub-circuitry is located; and
applying, by the gain switching control sub-circuitry within the discharging time period and the reading time period, a gain switching control signal to the corresponding gain switching sub-circuitry in accordance with the grayscale voltage information, so as to enable the first end of the gain switching sub-circuitry to be electrically connected to the second end of the gain switching sub-circuitry.

8. The method according to claim 7, wherein the grayscale voltage information comprises first grayscale voltage information and second grayscale voltage information;
the first grayscale voltage information is information indicating that the grayscale voltage is located within a first voltage range, and the second grayscale voltage information is information indicating that the grayscale voltage is located within a second voltage range;
the first voltage range is greater than a first predetermined voltage and smaller than a second predetermined voltage, and the second voltage range is greater than a third predetermined voltage and smaller than a fourth predetermined voltage; and
the first predetermined voltage is smaller than the second predetermined voltage, and the third predetermined voltage is smaller than the fourth predetermined voltage and greater than the second predetermined voltage,
wherein the applying, by the gain switching control sub-circuitry within the discharging time period and the reading time period, the gain switching control signal to the corresponding gain switching sub-circuitry in accordance with the grayscale voltage information so as to enable the first end of the gain switching sub-circuitry to be electrically connected to the second end of the gain switching sub-circuitry comprises:
applying, by the gain switching control sub-circuitry, a first gain switching control signal to a first gain switching sub-circuitry in accordance with the first grayscale voltage information, so as to enable a first end of the first gain switching sub-circuitry to be electrically connected to a second end of the first gain switching sub-circuitry; and
applying, by the gain switching control sub-circuitry, a second gain switching control signal to a second gain switching sub-circuitry in accordance with the second grayscale voltage information, so as to enable a first end of the second gain switching sub-circuitry to be electrically connected to a second end of the second gain switching sub-circuitry,
wherein the gain capacitive sub-circuitries comprise a first gain capacitive sub-circuitry and a second gain capacitive sub-circuitry having a capacitance greater than the first gain capacitive sub-circuitry,
wherein the first gain capacitive sub-circuitry is connected in series to the first gain switching sub-circuitry, and the second gain capacitive sub-circuitry is connected in series to the second gain switching sub-circuitry.

9. The method according to claim 8, wherein the photoelectrical signal application circuitry comprises a photosensing sub-circuitry, a read control sub-circuitry and a storage capacitor;
a control end of the read control sub-circuitry is connected to a read control line, and the master control circuitry further comprises a read control signal control sub-circuitry; and
the method further comprises generating, by the read control signal control sub-circuitry, a corresponding read control signal in accordance with the grayscale voltage information, and transmitting the read control signal to the read control line.

10. The method according to claim 9, wherein a resetting time period is set prior to the reading time period, and an integration time period is set between the resetting time period and the reading time period,
wherein the method further comprises:
within the resetting time period, resetting a voltage applied to a first end of the storage capacitor, so as to empty charge signals stored in the storage capacitor;
within the integration time period, converting, by the photosensing sub-circuitry, an optical signal from the pixel sub-circuitry into an electrical signal, and storing the electrical signal in the storage capacitor; and
within the reading time period, controlling, by the read control sub-circuitry under the control of the read control signal, the first end of the storage capacitor to be electrically connected to a negative phase input end of an operational amplifier, so that the operational amplifier outputs a voltage signal corresponding to the electrical signal acquired by the photosensing sub-circuitry to the read line,
wherein an integration time corresponding to the read control signal is a duration of the integration time period.

11. The method according to claim 10, wherein a first integration time corresponding to a first read control signal is greater than a second integration time corresponding to a second read control signal,
wherein the first read control signal is a read control signal corresponding to the first grayscale voltage information, and the second read control signal is a read control signal corresponding to the second grayscale voltage information.

12. The method according to claim 11, wherein an absolute value of a first adjustable voltage applied to the first voltage-adjustable input end is greater than an absolute value of a second adjustable voltage applied to a second voltage-adjustable input end; and
the first adjustable voltage is an adjustable voltage applied to the first voltage-adjustable input end corresponding to the first grayscale voltage information, and the second adjustable voltage is an adjustable voltage applied to the second voltage-adjustable input end corresponding to the second grayscale voltage information.

13. The method according to claim 10, wherein the photosensing sub-circuitry comprises a photosensitive diode, an anode of which is connected to a voltage-adjustable input end and a cathode of which is connected to the first end of the storage capacitor;
the number of the voltage-adjustable input ends is at least two;
the electrical signal detection module further comprises a bias voltage switching circuitry, and the master control circuitry further comprises a bias voltage control sub-circuitry; and
the anode of the photosensitive diode is connected to the at least two voltage-adjustable input ends via the bias voltage switching circuitry, and a control end of the bias voltage switching circuitry is connected to the bias voltage control sub-circuitry,
wherein the method further comprises applying, by the bias voltage control sub-circuitry, a bias voltage control signal to the bias voltage switching circuitry in accordance with the grayscale voltage information, so as to enable the corresponding voltage-adjustable input end to be electrically connected to the anode of the photosensitive diode.

14. A pixel circuit, comprising a plurality of pixel unit circuitries arranged in rows and columns, wherein each pixel unit circuitry comprises a pixel sub-circuitry and a pixel compensation circuitry, the pixel compensation circuitry comprises the electrical signal detection module according to claim 1, and the pixel unit circuitries in a same column are connected to a same read line.

15. A display device, comprising the pixel circuit according to claim 14 and a grayscale voltage determination circuit, wherein the grayscale voltage determination circuit is configured to acquire a grayscale voltage applied to each pixel sub-circuitry, determine a voltage range within which the grayscale voltage is located, and generate grayscale voltage information indicating the voltage range within which the grayscale voltage applied to the pixel sub-circuitry is located.

16. The pixel circuit according to claim 14, wherein
the master control circuitry comprises a master control sub-circuitry and a gain switching control sub-circuitry;
the master control sub-circuitry is configured to acquire grayscale voltage information so as to generate the discharge switching signal, and transmit the discharge switching signal to the discharge switching circuitry;
the grayscale voltage information is information indicating a voltage range within which the grayscale voltage applied to the pixel sub-circuitry is located; and
the gain switching control sub-circuitry is configured to apply the gain switching control signal to the corresponding gain switching sub-circuitry in accordance with the grayscale voltage information, so as to enable the first end and the second end of the gain switching sub-circuitry to be electrically connected to each other.

17. The pixel circuit according to claim 16, wherein
the photoelectrical signal application circuitry comprises a photosensing sub-circuitry, a read control sub-circuitry and a storage capacitor;
the photosensing sub-circuitry comprises a photosensing output end;
the photosensing sub-circuitry is configured to convert the optical signal from the corresponding pixel sub-circuitry into an electrical signal, and output the electrical signal via the photosensing output end;

a first end of the storage capacitor is connected to the photosensing output end, and a second end of the storage capacitor is connected to a first voltage input end;

a first end of the read control sub-circuitry is connected to the photosensing output end, and a second end of the read control sub-circuitry is connected to the negative phase input end of the operational amplifier; and the read control sub-circuitry is configured to, under the control of a read control signal, control the photosensing output end to be electrically connected to, or electrically disconnected from, the negative phase input end of the operational amplifier.

18. The pixel circuit according to claim 17, wherein a control end of the read control sub-circuitry is connected to the read control line, and the master control circuitry further comprises a read control signal control sub-circuitry configured to generate the read control signal in accordance with the grayscale voltage information and transmit the read control signal to the read control line.

19. The pixel circuit according to claim 17, wherein the electrical signal detection module further comprises at least two voltage-adjustable input ends, and the photosensing sub-circuitry comprises a photosensitive diode, a cathode of which is connected to the first end of the storage capacitor; and wherein the electrical signal detection module further comprises a bias voltage switching circuitry, and the master control circuitry further comprises a bias voltage control sub-circuitry;

an anode of the photosensitive diode is connected to the at least two voltage-adjustable input ends via the bias voltage switching circuitry;

a control end of the bias voltage switching circuitry is connected to the bias voltage control sub-circuitry; and the bias voltage control sub-circuitry is configured to apply a bias voltage control signal to the bias voltage switching circuitry in accordance with the grayscale voltage information, so as to enable the corresponding voltage-adjustable input end to be electrically connected to the anode of the photosensitive diode.

20. The electrical signal detection module according to claim 1, wherein each pixel sub-circuitry is a subpixel, and each pixel sub-circuitry is an Organic Light-Emitting Diode (OLED) pixel sub-circuitry.

* * * * *